United States Patent
Schaefer

(10) Patent No.: US 9,037,426 B2
(45) Date of Patent: May 19, 2015

(54) SYSTEMS AND METHODS FOR DETERMINING CELL CAPACITY VALUES IN A MULTI-CELL BATTERY

(75) Inventor: Sascha Schaefer, Selters (DE)

(73) Assignee: GM Global Technology Operations LLC, Detroit, MI (US)

( * ) Notice: Subject to any disclaimer, the term of this patent is extended or adjusted under 35 U.S.C. 154(b) by 809 days.

(21) Appl. No.: 13/107,171

(22) Filed: May 13, 2011

(65) Prior Publication Data

US 2012/0290234 A1 Nov. 15, 2012

(51) Int. Cl.
*G01R 31/36* (2006.01)
*B60L 11/18* (2006.01)
*H02J 7/04* (2006.01)

(52) U.S. Cl.
CPC ......... *G01R 31/3624* (2013.01); *B60L 11/1861* (2013.01); *H02J 7/044* (2013.01); *B60L 11/1866* (2013.01); *Y02T 10/7005* (2013.01); *Y02T 10/7061* (2013.01)

(58) Field of Classification Search
CPC ........................... B60I 11/1861; B60I 11/1866
USPC ......................................................... 702/63
See application file for complete search history.

(56) References Cited

U.S. PATENT DOCUMENTS

| | | | |
|---|---|---|---|
| 6,639,385 B2 | 10/2003 | Verbrugge et al. | |
| 6,700,350 B2 * | 3/2004 | Formenti et al. | 320/119 |
| 7,136,762 B2 * | 11/2006 | Ono | 702/63 |
| 7,193,392 B2 * | 3/2007 | King et al. | 320/118 |
| 7,768,233 B2 * | 8/2010 | Lin et al. | 320/132 |
| 7,928,691 B2 * | 4/2011 | Studyvin et al. | 320/116 |
| 2007/0080662 A1 * | 4/2007 | Wu | 320/110 |
| 2010/0052614 A1 * | 3/2010 | Mariels | 320/116 |
| 2011/0130986 A1 * | 6/2011 | Plett | 702/63 |
| 2011/0221400 A1 * | 9/2011 | Takizawa et al. | 320/166 |
| 2012/0133332 A1 * | 5/2012 | Ogane et al. | 320/134 |
| 2013/0320989 A1 * | 12/2013 | Inoue et al. | 324/427 |
| 2014/0336964 A1 * | 11/2014 | Okumura et al. | 702/63 |

FOREIGN PATENT DOCUMENTS

| | | |
|---|---|---|
| CN | 1415973 A | 5/2003 |
| CN | 101917038 A | 12/2010 |

OTHER PUBLICATIONS

Internet Web Site: http://liionbms.com/php/wp_soc_estimate.php; accessed May 12, 2011.

(Continued)

*Primary Examiner* — Sujoy Kundu
*Assistant Examiner* — Steven J Malone
(74) *Attorney, Agent, or Firm* — Dinsmore & Shohl LLP

(57) ABSTRACT

Systems and methods to determine cell capacities of a vehicle battery pack. Cell capacities may be determined using state of charge (SOC) estimates for the cells and a charge count for the battery pack. The SOC estimates may be determined when the SOC of the battery pack is below a lower threshold and above an upper threshold. Error values may also be generated for the cell capacity values.

17 Claims, 7 Drawing Sheets

(56) References Cited

OTHER PUBLICATIONS

Internet Web Site: http://homepages.which.net/~paul.hills/Batteries/BatteriesBody.html; accessed May 12, 2011.

http://www.liionbnns.conniphp/wp_soc_estimate.php, White Paper—Estimating the State of Charge of Li-Ion batteries, pp. 1-7, May 12, 2011.

http://homepages.which.net/~paul.hills/Batteries/BatteriesBody.html, Batteries V2.07, Jul. 5, 2004, printed May 12, 2011, pp. 1-18.

* cited by examiner

SYSTEMS AND METHODS FOR DETERMINING CELL CAPACITY VALUES IN A MULTI-CELL BATTERY

BACKGROUND OF THE INVENTION

The present invention relates generally to determining the cell capacities in a multi-cell battery, and more particularly to systems and methods determining cell capacity values based on the state of charge of the battery.

Automotive technology is rapidly expanding in the area of finding alternatives to using gasoline as the primary source of energy in vehicle propulsion systems. Many of these advances utilize either a hybrid mechanical-electrical system that recaptures some of the mechanical energy from the combustion engine as stored electrical energy, or a fully-electric propulsion system, which eliminates the need for an internal combustion engine entirely. With these advancements, the storage and management of electrical energy in vehicles has become of particular importance.

State of charge (SOC) is a commonly-used measure of the amount of charge available in a battery relative to the battery's capacity. In automotive applications that use fully electric or hybrid-electric propulsion systems, SOC measurements provide a useful indication of the amount of energy available to propel the vehicle. Similar to the information provided by a fuel gauge, an SOC measurement can provide a driver of an electric vehicle with an indication of how long the vehicle may travel before running out of energy.

The actual capacity of the battery is another important metric that denotes the overall amount of charge that can be stored in the battery. Typically, a battery is rated for capacity at its time of manufacture. However, as a battery ages, its capacity also decreases. In automotive applications, determination of the battery's actual capacity becomes extremely important because of its effect on SOC measurements. Where a battery's SOC measurement is somewhat analogous to how "full" a conventional fuel tank is in relation to its total volume (e.g., its capacity), batteries differ from conventional fuel tanks because their total capacities decrease over time. For example, a vehicle battery may only have 80% of its original capacity as it ages. Therefore, the actual capacity of a battery may be used to evaluate the overall condition and performance of the battery, in addition to adjusting its SOC estimations.

The amount of information available about the condition and performance of a vehicle battery system is limited when traditional battery capacity estimation techniques are used. Vehicle battery packs usually contain multiple modules which, in turn, include multiple battery cells. However, traditional techniques only estimate the battery capacity at the pack level and/or include numerous sources of error. Such techniques provide only limited information about the cells in the aggregate and fail to identify defective cells that may be underperforming. Inclusion of these cells into a pack-level capacity estimate may also skew the overall results for the pack.

SUMMARY OF THE PRESENT INVENTION

In one embodiment, a method for determining cell capacity values for a vehicle battery pack is disclosed. The method includes receiving, at a processor, sensor data indicative of the voltage of the pack, the currents of the pack, and voltages for a plurality of cells in the pack. The method also includes determining a first and a second set of state of charge values for the plurality of cells using a voltage-based strategy on the sensor data measured when the state of charge of the pack is below a lower threshold value and the sensor data measured when the state of charge of the battery pack is above an upper threshold value. The method further includes determining a charge count value for the battery pack using the sensor data, where the charge count is started when the state of charge of the battery pack is below the lower threshold value and stopped when the state of charge of the battery pack is above the upper threshold value. The method additionally includes generating difference values using the differences between the state of charge values in the first and the second sets, calculating cell capacity values by dividing the charge count value by the difference values, and storing the cell capacity values in a memory.

In another embodiment, a vehicle controller is disclosed. The controller has an interface configured to receive sensor data from a plurality of voltage and current sensors that is indicative of the voltage of the pack, the currents of the pack, and the voltages for a plurality of cells in the pack. The controller also includes a voltage-based state of charge generator configured to generate a state of charge value for the pack and first and second sets of state of charge values for the plurality of cells, where the first set is generated when the state of charge of the pack is below a lower threshold value and the second set is generated when the state of charge of the battery pack is above an upper threshold value. The controller additionally includes a charge counter configured to determine a charge count value for the battery pack using the sensor data. The charge count may be started when the state of charge of the battery pack is below the lower threshold value and stopped when the state of charge of the battery pack is above the upper threshold value. The controller may further include a rest timer configured to determine a rest time for the battery pack and a difference evaluator configured to generate difference values using the differences between the state of charge values in the first and the second sets. The controller may yet further include a cell capacity calculator configured to calculate cell capacity values by dividing the charge count value by the difference values.

In another embodiment, a system for determining cell capacity values for a vehicle battery is disclosed. The system includes a vehicle battery having a plurality of cells, voltage sensors configured to measure the voltages of the vehicle battery and the cells, and current sensors configured to measure the currents into and out of the battery. The system also includes a processing circuit that has an interface that receives voltage data from the voltage sensors and current data from the current sensors. The processing circuit also has a processor and a memory coupled to the processor. The memory stores executable instructions that, when executed by the processor, cause the processor to determine a first set of state of charge values for the plurality of cells using a voltage-based strategy on the voltage data measured when the state of charge of the pack is below a lower threshold value. The instructions also cause the processor to determine a second set of state of charge values for the plurality of cells using a voltage-based strategy on the sensor data on the voltage data measured when the state of charge of the battery pack is above an upper threshold value and to determine a charge count using the current data. The instructions further cause the processor to calculate cell capacity values using the charge count and the first and second sets of state of charge values, and to store the cell capacity values in the memory.

BRIEF DESCRIPTION OF THE DRAWINGS

The following detailed description of specific embodiments can be best understood when read in conjunction with the following drawings, where like structure is indicated with like reference numerals and in which.

Figure 1:
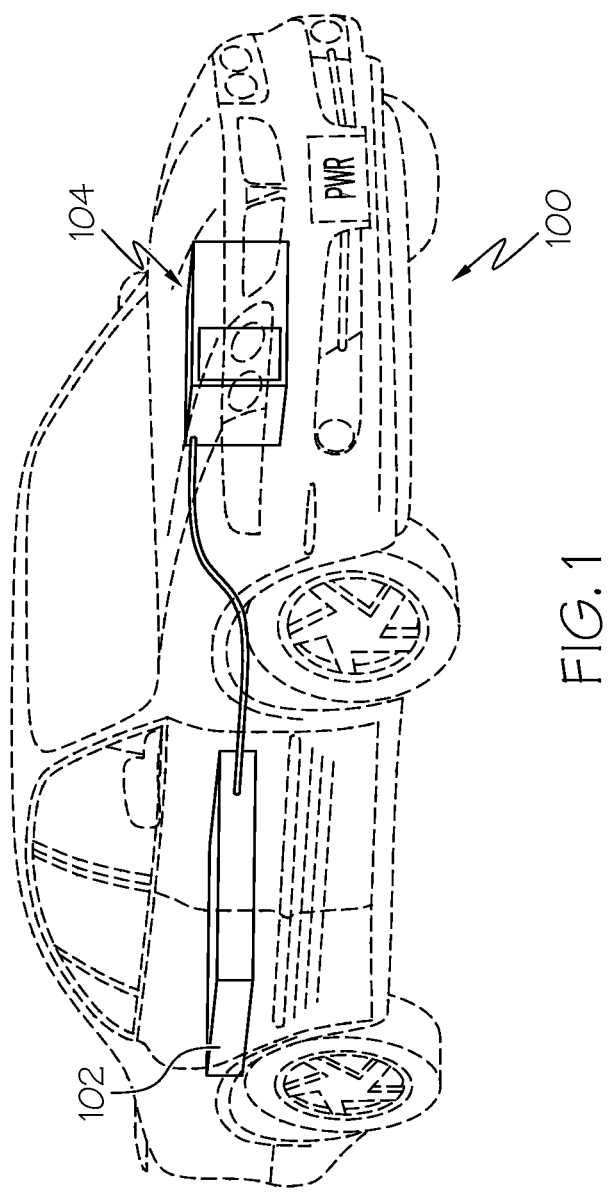
FIG. 1 is a schematic illustration of a vehicle having a battery pack.

The embodiments set forth in the drawings are illustrative in nature and are not intended to be limiting of the embodiments defined by the claims. Moreover, individual aspects of the drawings and the embodiments will be more fully apparent and understood in view of the detailed description that follows.

DETAILED DESCRIPTION OF THE PREFERRED EMBODIMENTS

As stated above, present techniques to determine battery capacities focus on the pack-level and fail to account for variations in the individual cells. Capacity estimations at the cell level, according to an aspect of the present invention, allows for more information about the health of the battery to be determined, since underperforming or defective cells can be identified. In addition, identification of underperforming or defective cells allows for corrective measures to be taken by regulating the charging and discharging of the individual cells.

Referring now to FIG. 1, vehicle 100 is shown, according to an exemplary embodiment. Vehicle 100 includes battery pack 102 which provides electrical power to propel vehicle 100 using either a hybrid-electric or a fully-electric propulsion system. Battery pack 102 may include multiple battery cells, modules, or a collection of discrete batteries working in conjunction to provide propulsion power to vehicle 100. Vehicle 100 also includes vehicle controller 104. Vehicle controller 104 is operatively connected to battery pack 102 and provides monitoring and control over the operation of battery pack 102. Vehicle controller 104 may also monitor or control one or more other functions of the vehicle. For example, vehicle controller 104 may provide information about the operational state of battery pack 102 to an electronic display within vehicle 100 to convey the information to the vehicle's driver. Vehicle controller 104 may also provide control over other systems of vehicle 100. For example, vehicle controller 104 may control the operations of the engine, the electrical system, or the exhaust system of vehicle 100.

Vehicle controller 104 may be a processing circuit that includes any number of hardware and software components. For example, vehicle controller 104 may include a microprocessor, an application-specific integrated circuit (ASIC), or a field-programmable gate array (FPGA). Vehicle controller 104 may also include machine instructions stored within a memory device in vehicle controller 104 which are capable of implementing one or more monitoring or control functions when executed by a processor in vehicle controller 104. For example, vehicle controller 104 may include one or more memory devices such as a RAM, ROM, EEPROM, flash memory, CD-ROM, DVD-ROM, or any other non-transitory memory capable of storing the machine instructions for vehicle controller 104.

Battery Capacity Estimation

The actual capacity of battery pack 102 denotes for a full battery how much current can be drawn from battery pack 102, and for how long, before battery pack 102 is depleted. In some embodiments, the capacity of battery pack 102 may be determined using a charge count (e.g., from current measurements) over the course of time, in combination with SOC measurements.

Typically, a battery capacity is measured in Ampere-hours (Ah) and standardized to a period of one hour. For example, a battery having a capacity of 20 Ah could be expected to provide twenty Ampere of current for one hour, before the battery is depleted. In effect, battery capacity is a measure of charge, since current is defined as:

$$I = \frac{Q}{t}$$

where I is the electrical current (measured in Amperes), Q is an amount of charge (measured in Coulombs), and t is an amount of time. Multiplying both sides by an amount of time gives:

$$I*t=Q$$

Therefore, battery capacity, measured in Ampere-hours (e.g., current*time), is equivalently a measure of charge and can also be denoted in Coulombs.

Since battery capacity is effectively a measure of charge, a battery's capacity can be determined using a charge count. For example, current measurements can be used to track the amount of charge into and out of battery pack 102. Integration of the current measurements over a span of time gives to the amount of charge that has either entered the battery or left the battery during that span of time. Such a technique is sometimes referred to as a "Coulomb-counting" technique. By way of analogy only, this is somewhat similar to measuring how many gallons of gasoline have been added or depleted from a traditional fuel tank.

If the SOC of battery pack 102 is also available, it can be used with the charge count to determine the actual capacity of battery pack 102 using:

$$\text{capacity} = \frac{Q}{SOC_2 - SOC_1}$$

where $SOC_1$ is an initial SOC estimate, $SOC_2$ is a final SOC estimate, and Q is the charge count. By way of analogy, this is similar to determining the change in how "full" a traditional fuel tank is over a period of time and dividing it by how many gallons have left the tank during this time. For example and not a limitation, if the SOC of battery pack 102 changes from 100% (e.g., $SOC_1$) to 95% (e.g., $SOC_2$) over the course of an hour, and the amount of charge that has left the battery in this time (e.g., Q) is equal to 3600 Coulombs, battery pack 102 has provided one Ampere of current in that hour and has lost 5% of its charge. In such a case, this is equivalent to battery pack 102 having a capacity of 20 Ah, since it would take 20 hours to fully deplete battery pack 102 at this rate.

Voltage-Based SOC Estimation

One technique to estimate the SOC of battery pack 102 is by using a voltage-based strategy. Generally, the SOC of a battery is related to its open-circuit voltage. This means that voltage measurements of battery pack 102 can be used to estimate its SOC, current measurements can be used for a charge count, and the SOC values and charge count can be used to determine the actual capacity of battery pack 102.

Figure 2:
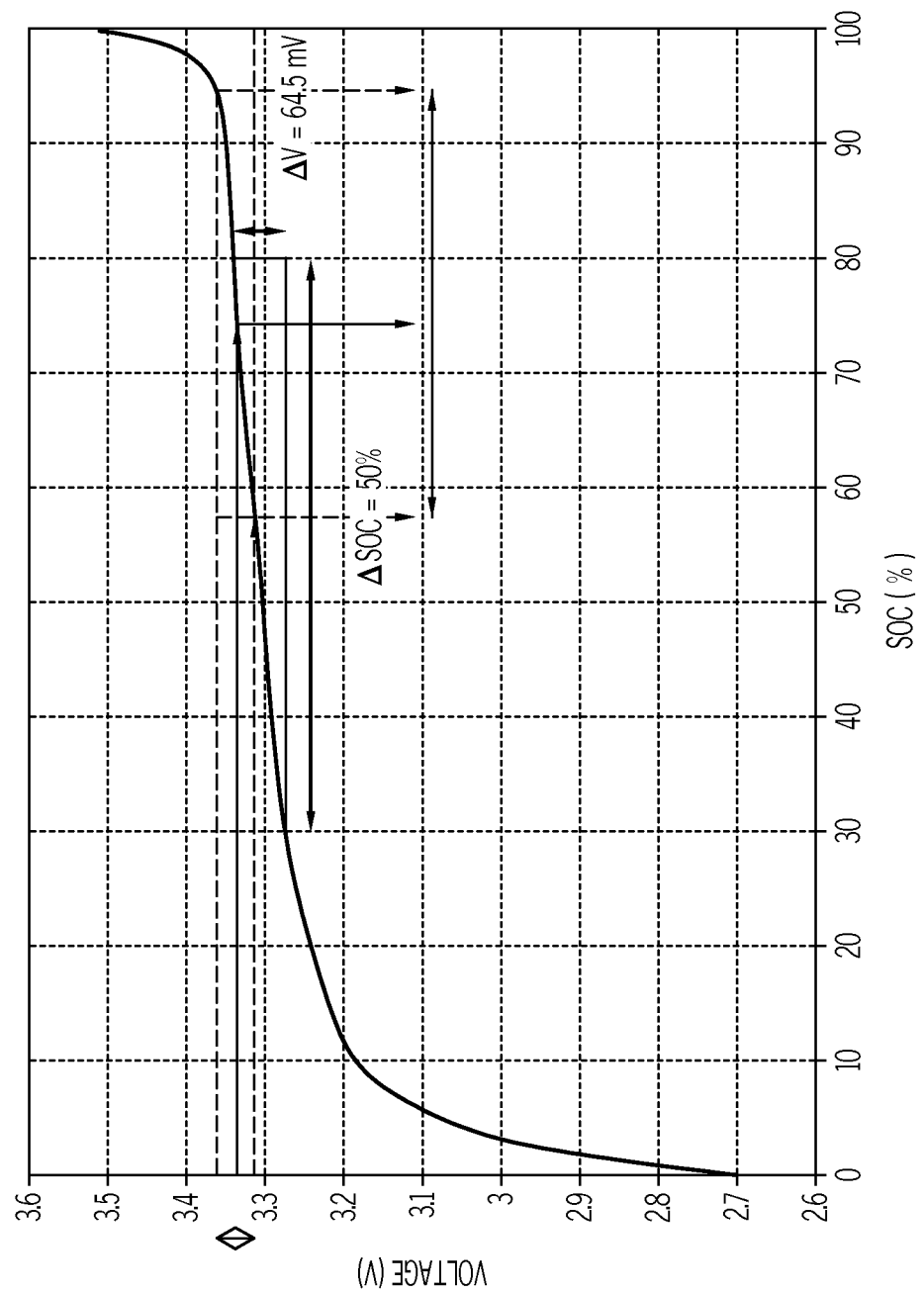
FIG. 2 is a plot of the open circuit voltage of a LiFePO$_4$ battery as a function of its state of charge.

Referring now to FIG. 2, a plot of the open circuit voltage for a LiFeO$_4$ battery is shown as a function of the battery's SOC. In the midrange for the SOC, the open circuit voltage for the battery changes very little, leading to potential error in any SOC estimations based on voltage measurements of the battery. For example, the tolerance of the voltage sensor providing the measurements may contribute to the overall uncertainty of the actual voltage of the battery. As a further consideration, the voltage-SOC relationship is also dependent on the temperature of the battery, the rest time for the battery (e.g., when the battery is not providing or receiving charge), and the diffusion constant of the battery.

Several voltage-based techniques exist to estimate the SOC of the battery using a measured voltage. For example, an estimation of the SOC may be made by comparing a raw open circuit voltage value to a known voltage-SOC relationship stored within a memory or lookup table. In other techniques, linear regression may be used to determine the SOC. For example, U.S. Pat. No. 7,768,233 to Lin, et al., which is owned by the assignee of the present disclosure and also hereby incorporated by reference, discloses using an equivalent circuit model and regression techniques to determine the open circuit voltage and estimated SOC values.

One way to improve the accuracy of the SOC estimate is to use a voltage-based strategy when the voltage is above an upper threshold value or below a lower threshold value. In regions where the battery has a steep voltage-SOC characteristic, the effects of uncertainty of the actual voltage (e.g., due to the voltage sensor's tolerance, or the like) on the SOC estimation are minimized. In some embodiments, the threshold values may define the range of voltage values that correspond to the relatively flat portion of a voltage-SOC characteristic. For example, a lower threshold of 3.0 volts and an upper threshold of 3.4 volts would minimize the effects of uncertainty of the voltage reading (e.g., due to the voltage sensor's tolerance, etc.) on the SOC estimate. In another example, a lower threshold of an SOC of 35% may be used.

Figure 3:
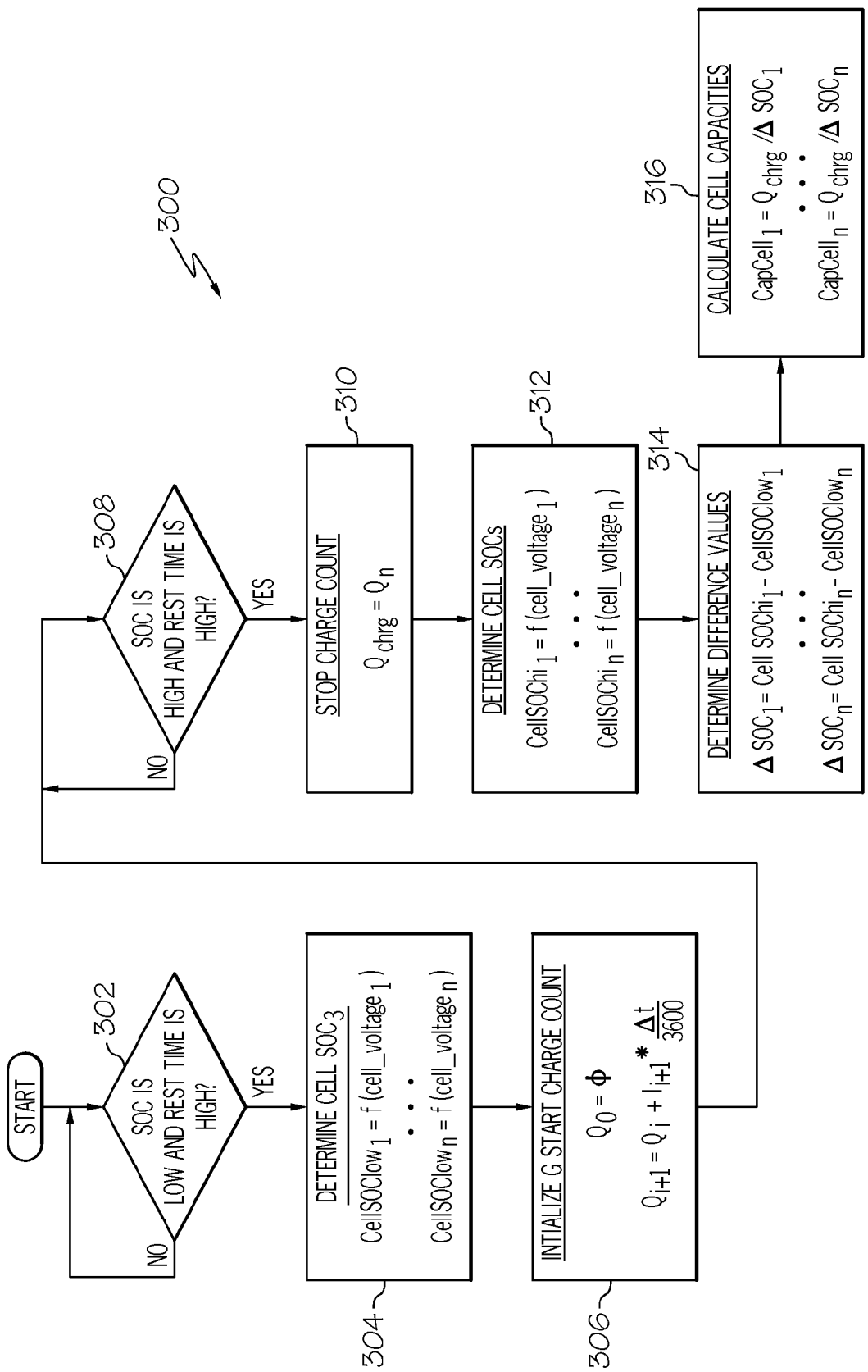
FIG. 3 shows a method for calculating cell capacities for a vehicle battery pack, according to an aspect of the present invention.

Referring now to FIG. 3, a method 300 for determining cell capacities is shown, according to an exemplary embodiment. Determining capacities at the cell level of a battery pack allows more information about the battery pack to be obtained. In some embodiments, cell capacities can be used to diagnose problematic cells, to compute a capacity distribution for the battery pack, and/or for cell balancing. In addition, the achievable accuracy may be greater when capacities are determined at the cell level, rather than at the battery pack level.

At step 302, a determination may be made as to whether the SOC of the battery pack is low and its rest time is high. In some embodiments, a voltage-based strategy may be used to estimate the SOC of the battery pack and a voltage measurement for the battery pack compared to a lower threshold value. If the voltage measurement is below the lower threshold value, the SOC of the battery pack is also low. Since the rest time of the battery pack also affects the accuracy of an SOC estimation, a rest timer may be used to determine how long the battery pack has been at rest (e.g., the battery is not receiving or supplying power). The rest time determined by the timer may then be compared to a time threshold value, to determine if the rest time is sufficiently high enough to overcome the effects of diffusion on the battery pack. If the SOC of the battery pack is not low, or if its rest time is not long enough to overcome the effects of diffusion, the calculation of the cell capacities may be delayed until these conditions are met.

At step 304, SOC values for the individual cells of the battery pack may be determined. In some embodiment, a voltage-based strategy may be used to determine the SOC estimations for the individual cells. Voltage measurements taken at the individual cells may be compared against voltage-SOC characteristics for the cells stored in a memory or lookup table to determine the individual cell capacities. Since the SOC of the battery pack is low (e.g., its voltage is below a lower threshold value), the accuracy of the SOC estimations for the individual cells is also increased.

At step 306, a charge count may be initiated and started when the SOC of the battery pack is low and its rest time is high. In some embodiments, the charge count may be determined by taking current measurements at the battery pack and multiplying by a time differential. For example, the following equation may be used in such embodiments:

$$Q_{i+1} = Q_i + I_{i+1} * \frac{\Delta t}{3600}$$

where $Q_{i+1}$ is the latest charge count, $Q_i$ is the previous charge count and may be initialized to zero for $Q_0$, $I_{i+1}$ is the latest current measurement, and $\Delta t$ is the change in time between current measurements. The charge count may also be directly converted to Ampere-hours by dividing by 3600, since 1 Ampere-hour is equal to 3600 Coulombs.

At step 308, a determination may be made as to whether the SOC of the battery pack is high and the rest time is also high (e.g., the SOC is above an upper threshold and the rest time is above a time threshold). As the battery pack charges, its SOC and open-circuit voltage will also increase, as shown in FIG. 2. An upper threshold value may be used to ensure that the effects of error due to the tolerances of the voltage sensors are minimized. Likewise, a time threshold may also be used to ensure that the effects of diffusion are also minimized. In some embodiments, the vehicle battery pack may be charged as part of its normal charging procedures to increase the SOC of the battery pack (e.g., a driver plugs the vehicle into a wall socket, the engine recaptures breaking energy as electricity, etc.). In such a case, the rest time may also be part of the normal use of the vehicle (e.g., the vehicle is not running).

At step 310, the charge count may be stopped when the SOC of the battery pack is high and its rest time is also high. As the battery pack is charged, its SOC also increases. In some embodiments, an upper threshold value may be used to define when its SOC is high enough to reduce the effects of sensor tolerances on the SOC estimations. In other embodiments, the charging may be stopped when the SOC reaches the upper threshold value and the battery may be rested for a period of time to reduce the effects of diffusion on SOC estimations. For example, a time threshold value may be used that is based on the diffusion time constant for the battery pack.

At step 312, SOC values for the individual cells may be determined when the SOC of the battery pack is high and its rest time is high. Similar to the cell SOC values determined in step 304, voltage measurements may be taken at the individual cells and compared to a voltage-SOC characteristic to estimate the SOC values, according to some embodiments. Since the voltage-SOC characteristic of certain batteries (e.g., lithium ion batteries, etc.) is relatively flat in the midrange for the SOC values, continuing the charge count until the voltage and corresponding SOC estimation are above an upper threshold value improves accuracy by minimizing the effects of sensor tolerances, etc.

At step 314, the cell SOC values determined in steps 304 and 312 may be used to determine difference values. In some embodiments, the difference values may be the simple difference between the high and low SOC estimations for a given cell. In other embodiments, a weighting factor may be applied. For example, one or both of the SOC estimations may be multiplied by a weighting factor to account for inaccuracies in the estimation process.

At step 316, the cell capacities for the individual cells may be calculated. In some embodiments, the cell capacities may be determined using a charge count for the battery pack and the difference in SOC measurements for the individual cells. For example, the following may be used to determine a cell's capacity:

$$CapCell_i = \frac{Q_{chrg}}{\Delta SOC_i}$$

where $CapCell_i$ is capacity of the ith cell in the battery pack, $Q_{chrg}$ is the charge count, and $\Delta SOC_i$ is the difference value for the ith cell.

In some embodiments, capacity error values may also be determined using:

$$cell\_cap\_error_i = \frac{Q_{chrg}}{\Delta SOC_i^2} * \frac{dSOC}{dV_{OC}} * \Delta V_{OC}$$

where $cell\_cap\_error_i$ is the cell capacity error value for the ith cell, $Q_{chrg}$ is the charge count value for the battery pack, $\Delta SOC_i$ is the difference value for the ith cell, SOC is the state of charge of the battery pack, $V_{OC}$ is the open-circuit voltage of the battery pack, and $\Delta V_{OC}$ is an error value associated with the voltage sensor that measures $V_{OC}$ (e.g., its tolerance, etc.).

Figure 4:
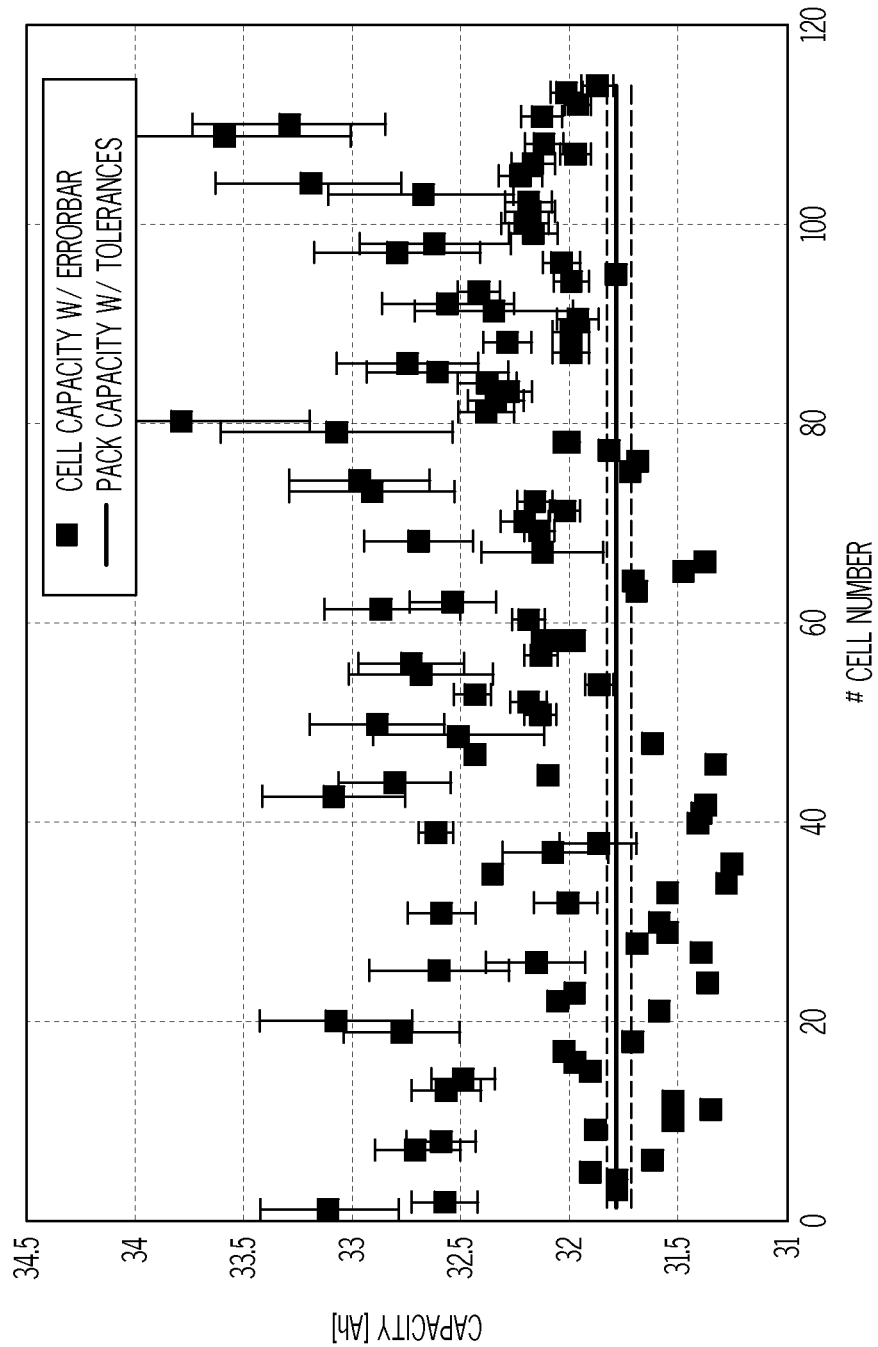
FIG. 4 is a plot of a cell capacity distribution, according to an aspect of the present invention.

Referring now to FIG. 4, a cell capacity distribution is shown, according to an exemplary embodiment. As shown, the battery pack capacity was calculated using voltage-based SOC estimates using the pack voltage and charge counting. A range of error is also shown surrounding the determined battery pack capacity to denote the amount of error attributable to the tolerances of the voltage sensors used to determine the SOC estimates for the pack. Calculated cell capacities are also shown with their corresponding error ranges. Since the pack capacity cannot be higher than the lowest cell capacity, FIG. 4 also shows a systematic error, which is included in the pack capacity value.

Knowledge about the individual cell capacities can be used to enhance both cell balancing techniques and diagnostic functions of the vehicle. For example, cell balancing techniques generally control the charging and discharging of cells. Knowledge of the individual cell capacities, as opposed to just the pack-level capacity, may be used to prevent the pack performance to decrease under the single cell performances. Similarly, diagnostic functions may make use of the individual cell capacities to identify cells that may need to be repaired or replaced.

By taking the length of the error bars into account and also the position of the cells in a voltage sorted list at the lower and the upper threshold, diagnostic functions and cell-balancing techniques may be performed. Critical cells having the lowest capacities will demonstrate the lowest voltages at the lower threshold and the highest voltages at the upper threshold. This results in small error bars for their respective cells and, therefore, in a high confidence in their determined capacity values. Therefore, diagnostic functions can be performed using this information to determine whether a cell is defective. In addition, the maximal achievable pack capacity corresponds to the lowest cell capacity. This will be reached, if one specific cell has the lowest voltage at the lower threshold and at the same time the highest voltage at the upper threshold. To reach this, cell balancing may be performed using the voltage information from their respective snapshot points.

Figure 5:
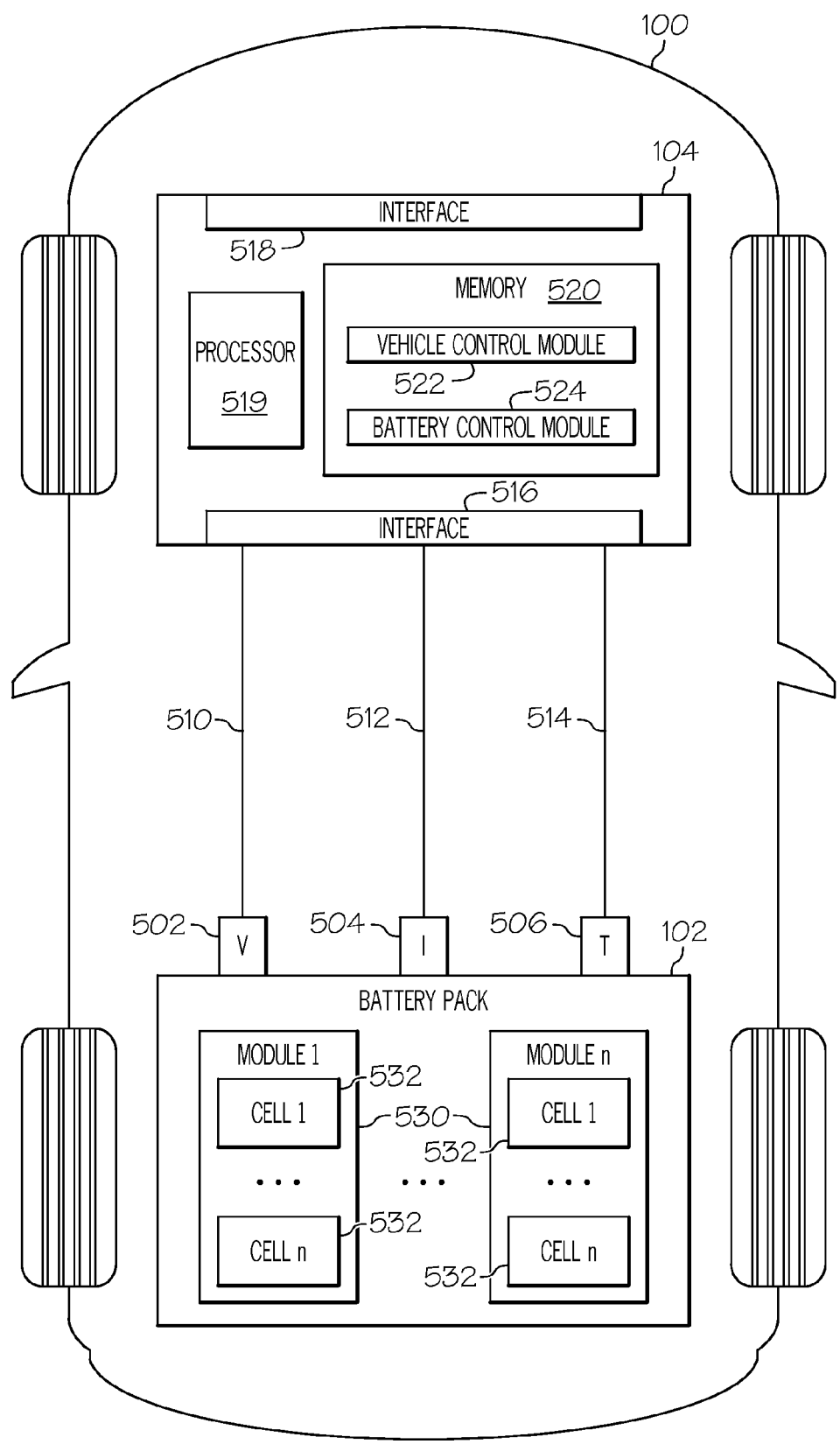
FIG. 5 is a detailed schematic illustration of the vehicle of FIG. 1, according to an aspect of the present invention.

Referring now to FIG. 5, a detailed, schematic illustration of vehicle 100 is shown, according to an exemplary embodiment. Battery pack 102 includes modules 530, which contain battery cells 532. Voltage sensors 502 measure the voltage of battery pack 102, modules 530, and/or cells 532 and provides voltage values to interface 516 of controller 104 via bus line 510. Current sensors 504 measures the current of battery pack 102, modules 530, and/or cells 532 and provides current values to interface 516 of controller 104 via bus line 512. Temperature sensors 506 measures the temperature of battery pack 102, modules 530, and/or cells 532 and provides temperature values to interface 516 of controller 104 via bus line 514. Sensors 502, 504, and 506 may be any number of sensors or configurations to measure the voltages, currents, and temperatures associated with battery pack 102. For example, temperature sensor 506 may be a single temperature sensor, while voltage sensors 502 and current sensors 504 may be a combined integrated circuit that measures both voltage and current. It should be appreciated that any number of different combinations of sensors and sensor configurations may be used, without deviating from the principles or teachings of the present disclosure.

Bus lines 510, 512, and 514 may be any combination of hardwired or wireless connections. For example, bus line 510 may be a hardwired connection to provide voltage readings to controller 104, while bus line 512 may be a wireless connection to provide current readings to controller 104. In some embodiments, bus lines 510, 512 and 514 are part of a shared data line that conveys voltage, current, and temperature values to controller 104. In yet other embodiments, lines 510, 512, and 514 may include one or more intermediary circuits (e.g., other microcontrollers, signal filters, etc.) and provide an indirect connection between sensors 502, 504, 506 and controller 104.

Interface 516 is configured to receive the sensor data from sensors 502, 504 and 506 via lines 510, 512, and 514. For example, interface 516 may include one or more wireless receivers, if any of lines 510, 512, or 514 are wireless connections. Interface 516 may also include one or more wired ports, if any of lines 510, 512, or 514 are wired connections. Interface 516 may also include circuitry configured to digitally sample or filter the sensor data from 502, 504 and 506. For example, interface 516 may sample the current data received from current sensors 504 via bus line 512 at discrete times (e.g., k, k+1, k+2, etc.) to produce discrete current values (e.g., I(k), I(k+1), I(k+2), etc.).

Controller 104 is shown to include processor 519, which may be one or more processors communicatively coupled to memory 520 and interfaces 516 and 518. Memory 520 may be any form of memory capable of storing machine-executable instructions that implement one or more of the functions disclosed herein, when executed by processor 519. For example, memory 520 may be a RAM, ROM, flash memory, hard drive, EEPROM, CD-ROM, DVD, other forms of non-transitory memory devices, or any combination of different memory devices. In some embodiments, memory 520 includes vehicle control module 522, which provides control over one or more components of vehicle 100. For example, vehicle control module 522 may provide control over the engine of vehicle 100 or provide status condition information (e.g., vehicle 100 is low on fuel, vehicle 100 has an estimated number of miles left to travel based on the present SOC of battery pack 102, etc.) to one or more display devices in the interior of vehicle 100 via interface 518. In some embodiments, vehicle control module 522 may also communicate with other processing circuits (e.g., an engine control unit, an on-board diagnostics system, etc.) or other sensors (e.g., a mass airflow sensor, a crankshaft position sensor, etc.) via interface 518.

Interface 518 may provide one or more wired or wireless connections between processor 104 and the various systems of vehicle 100. For example, interface 518 may provide a wired connection between processor 104 and a dashboard display and a wireless connection between processor 104 and an on-board diagnostics system. In some embodiments, interface 518 may also provide a wireless connection between processor 104 and other computing systems external to vehicle 100. For example, processor 104 may communicate status condition information to an external server via a cellular, WiFi, or satellite connection. Interface 518 may also include one or more receivers configured to send and receive location information for vehicle 100. For example, interface 518 may include a GPS receiver or cellular receiver that utilizes triangulation to determine the location of vehicle 100.

Memory 520 is further shown to include battery control module 524, which is configured to determine and store the state of charge information about battery pack 102. Battery control module 524 receives battery sensor data from interface 516 and utilizes the sensor data to determine the SOC and capacity values for battery pack 102. Battery control module 524 may receive and provide the determined SOC value to vehicle control module 522 or to other electronic devices via interface 518. For example, battery control module 524 may determine that the overall SOC of battery pack 102, based on its actual capacity, is presently at 65% and provide an indication of this to a charge gauge in the interior of vehicle 100 via interface 518. Battery control module 524 may also receive one or more operating parameters via interface 518 from other systems or devices. For example, battery control module 524 may receive data corresponding to a mapping of open-circuit voltages to SOC values for a cell of battery pack 102. In some embodiments, battery control module 524 may also provide control over the power draw, charging, cell balancing, etc. of battery pack 102.

Figure 6:
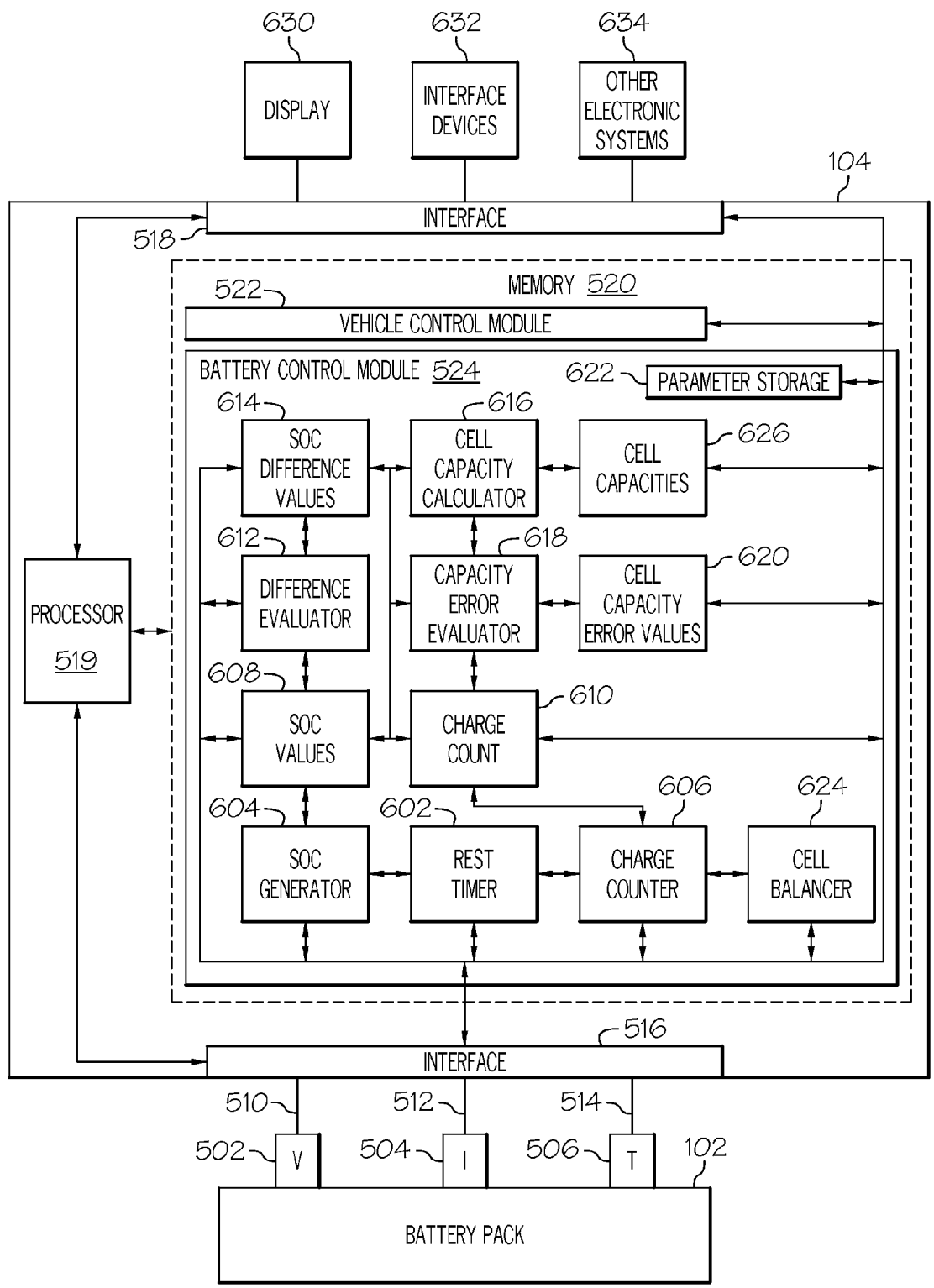
FIG. 6 is a detailed schematic illustration of the battery control module of FIG. 5, according to an aspect of the present invention.

Referring now to FIG. 6, a detailed diagram of battery control module 524 is shown, according to an exemplary embodiment. Battery control module includes battery rest timer 602, which receives sensor data from sensors 502, 504 and/or 506 via interface 516. Battery rest timer 602 uses the sensor data to determine a rest time for battery pack 102. For example, if vehicle 100 is not currently running, battery rest timer 602 may receive an indication from current sensors 504 that no current is presently entering or leaving battery pack 102. Battery rest timer 602 may then begin one or more timing sequences to determine the length of time that battery pack 102 is not in use. In such a case, the timing sequence may continue until an indication is received from current sensors 504 that current has been detected. Battery rest timer 602 uses the timing sequence to generate one or more battery rest values, which may be stored in parameter storage 622. In other embodiments, battery rest timer 602 may determine the battery rest time using one or more parameters stored in parameter storage 622. For example, parameter storage 622 may include parameters received from other electronic systems 634 that are indicative of the running state of the vehicle (e.g., the vehicle is idling, the vehicle is off, the vehicle is moving, etc.). In another example, parameter storage 622 may receive an indication from the ignition of vehicle 100 via interface 518 whenever vehicle 100 is turned off or started and may store one or more parameters related to these events.

SOC generator 604 receives voltage, current, and temperature data from interface 516 and uses them to generate SOC values 608. In some embodiments, SOC generator 604 uses a voltage-based strategy to generate SOC values 608 using one or more voltage-SOC characteristics stored in parameter storage 622. For example, voltage-SOC characteristics may vary depending on the amount of rest time of a battery, the temperature of the battery, the charging state of the battery (e.g., charging or discharging), etc. Different voltage-SOC characteristics may be stored in parameter storage 622 and may be retrieved by SOC generator 604 based on the sensor data received from interface 516 and a rest count from rest timer 602.

SOC generator 604 may also retrieve an upper and a lower threshold value from parameter storage 622 to evaluate the SOC of battery pack 102. In some embodiments, the upper and lower threshold values may be reference voltage values that SOC generator 604 compares to sensor data indicative of the open-circuit voltage of battery pack 102. In another embodiment, the upper and lower threshold values may be reference SOC values that SOC generator 604 compares against calculated SOC values. In either embodiment, SOC generator 604 uses the threshold values to determine whether the SOC of battery pack 102 is above or below the thresholds, since the open-circuit voltage of battery pack 102 and its SOC are interrelated.

If SOC generator 604 determines that the SOC of battery pack 102 is below a lower threshold value, or above an upper threshold value, it may also verify that the rest time received from rest timer 602 is also above a time threshold stored in parameter storage 622. In some embodiments, parameter storage 622 stores one or more rest time thresholds. For example, the amount of time necessary to minimize the effects of diffusion on the SOC estimation for battery pack 102 may vary with temperature. In this case, SOC generator 604 may use the sensor data received from interface 516 and use it to retrieve a rest time threshold value from parameter storage 622.

If the rest time from rest timer 602 is above the retrieved rest time threshold, and the SOC is above or below their corresponding threshold values, SOC generator 604 may use the sensor data received from interface 516 to generate SOC values 608 for one or more cells in battery pack 102. In this way, SOC values 608 may store a set of SOC values for the cells when the SOC of battery pack 102 is low and another set of SOC values for the cells when the SOC of battery pack 102 is high. In one embodiment, SOC generator 604 may also provide an indication to charge counter 606 that the SOC of battery pack 102 is above the upper threshold value or below the lower threshold value.

If charge counter 606 receives an indication from SOC generator 604 that the SOC of battery pack 102 is below the lower threshold, and determines that the rest time from rest timer 602 is above a rest time threshold stored in parameter storage 622, charge counter 606 may initialize and begin a charge count. In some embodiments, charge counter may utilize sensor data from interface 516 indicative of a current of battery pack 102 and time information from rest timer 602 to determine the charge count. If charge counter 606 receives an indication from SOC generator 604 that the SOC of battery pack 102 is above the upper threshold value, it may stop the charge count and store the current count as charge count 610.

Difference evaluator 612 may receive an indication from SOC generator 604 that the SOC of battery pack 102 is above the upper threshold value and use SOC values 608 to generate SOC difference values 614. For example, SOC values 608 may contain sets of SOC values for the cells of battery pack 102, where one set corresponds to battery pack 102 having an SOC below a lower threshold and the other set corresponds to battery pack 102 having an SOC above an upper threshold. In some embodiments, SOC difference values 614 are the simple differences between these sets. In other embodiments, difference evaluator 612 may apply a scaling or weighting to one or both SOC values.

Cell capacity calculator 616 calculates cell capacities 626 using SOC difference values 614 and charge count 610. In some embodiments, cell capacity calculator divides charge count 610 by SOC difference values 614 to calculate cell capacities 626. In some embodiments, cell capacities 626 may be provided to display 630, interface devices (e.g., a touch-screen display, a speaker, or the like), or to other electronic systems (e.g., other controllers, a remote computer system, or the like) via interface 518. Cell capacities 626 may also be used by processor 519 to correct SOC estimations provided to a driver via display 630, interface devices 632, or electronic systems 634. In other embodiments, cell capacities 626 may also be provided to processor 519 to determine a cell capacity distribution over some or all of battery pack 102 or to cell balancer 624 for use in cell balancing. In yet other embodiments, cell capacity calculator 616 may be further configured to determine a cell capacity distribution over the entire battery pack using cell capacities 626.

In some embodiments, cell capacity calculator 616 may also use cell capacities 626 to determine an estimate for the overall capacity of battery pack 102. In general, the pack capacity is always lower or equal to the lowest cell capacity. Cell capacity calculator 616 may utilize this relationship and the spread of values in cell capacities 626 to estimate the overall capacity of battery pack 102.

Capacity error evaluator 618 uses SOC values 608, difference values 614, charge count 610, and sensor data from interface 516 to generate cell capacity error values 620. While the accuracy of cell capacities 626 may be improved by calculating their underlying SOC values 608 when the SOC of battery pack 102 is above or below threshold values, sources of error may still remain for the individual cells. In some embodiments, capacity error evaluator 618 may calculate cell capacity error values 620 using the following calculation:

$$\text{cell\_cap\_error}_i = \frac{Q_{chrg}}{\Delta SOC_i^2} * \frac{dSOC}{dV_{OC}} * \Delta V_{OC}$$

where cell_cap_error$_i$ is the cell capacity error value for the ith cell, $Q_{chrg}$ is the charge count value for the battery pack, $\Delta SOC_i$ is the difference value for the ith cell, SOC is the state of charge of the battery pack, $V_{OC}$ is the open-circuit voltage of battery pack 102, and $\Delta V_{OC}$ is an error value associated with the voltage sensor that measures $V_{OC}$ (e.g., its tolerance, etc.).

In some embodiments, capacity error values 620 may provide a range relative to cell capacities 626. For example, a particular cell in battery pack 102 may have an actual cell capacity within a range defined by its cell capacity in cell capacities 626 and the error range defined by its error values in cell capacity error values 620. In some embodiments, capacity error evaluator 618 may also use cell capacity error values 620 to identify those cells having the lowest cell capacities (e.g., those cells having the smallest cell capacity error values).

Cell balancer 624 performs cell balancing, a technique that regulates the flow of a cell balancing current to the individual cells of battery pack 102. Cell balancing may regulate the flow of a cell balancing current to and from the individual cells, in order to distribute the use of the cells by vehicle 100 more evenly. For example, as the cells in battery pack 102 age, their individual capacities may differ. Cell balancer 624 may use cell capacities 626 and/or cell capacity error values 620 to determine which cells should be charged or discharged, the amount of charging or discharging, and for how long the cells should be charged or discharged. In one embodiment, cell balancer 624 may perform cell balancing to ensure that a specific cell has the lowest voltage when the SOC of the pack is low and the highest voltage when the SOC of the pack is high. In another embodiment, cell balancer 624 may perform cell balancing to minimize one or more error values in cell capacity error values 620. In some embodiments, cell balancer 624 may also perform diagnostic functions by determining which cell capacities 626 are defective (e.g., above or below a given threshold), and providing an indication of this determination to vehicle control module 522, display 630, interface devices 632, and/or other electronic systems 634.

Parameter storage 622 may include any number of user or system defined parameters that override or control the functions of battery control module 524. For example, parameter may include parameters that control how often cell capacities 626 are calculated, how cell capacities 626 are used for diagnostic functions, or how cell balancing is performed by cell balancer 624.

Figure 7:
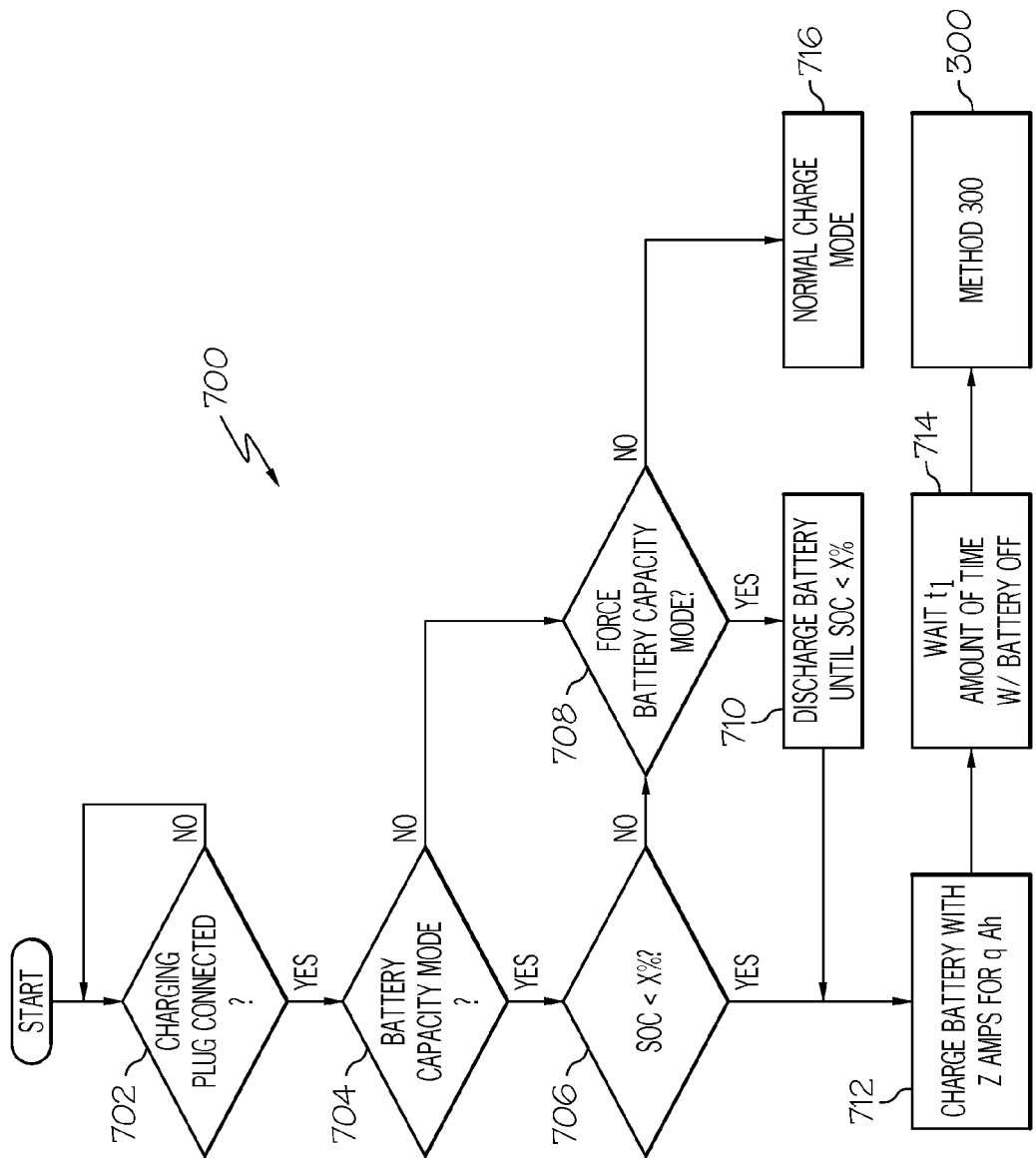
FIG. 7 is a flow diagram of a method for charging a vehicle battery pack, according to an aspect of the present invention.

Referring now to FIG. 7, a method 700 for charging a vehicle battery pack is shown, according to an exemplary embodiment. Method 700 may be utilized in conjunction with method 300 to determine cell capacity values as part of the charging process.

At step 702, a determination is made as to whether a charging plug is connected. For example, vehicle 100 may also have a charging plug to replenish the charge in battery pack 102 using a home or industrial wall socket. Battery control module 524 may receive a signal from voltage sensors 502 or current sensors 504 that power is being provided to battery pack 102 via the charging plug. If the charging plug is determined to not be connected, further processing of method 700 may be delayed until such a time that a plug is connected. However, if a plug is connected, method 700 may proceed to step 704 for further processing.

At step 704, a determination is made as to whether the vehicle is in a battery capacity mode. Generally, a battery capacity mode corresponds to an indication that the previously determined capacity of the battery pack should be updated. Factors that may be used to determine whether a vehicle is in a battery capacity mode include, but are not limited to, the length of time from the previous capacity calculation and the degree of accuracy of the previous capacity calculation. For example, vehicle 100 may be placed in a battery capacity mode by battery control module 524 if cell capacities 624 are two to three weeks old.

At step 706, if the vehicle is in a battery capacity mode, a determination is made as to whether the SOC of the battery pack is below a lower threshold value. In some embodiments, this step may be performed in parallel or in conjunction with step 302 of method 300. For example, SOC generator 604 may utilize sensor data received via interface 516 and a lower threshold value stored in parameter storage 622 to determine if the SOC of battery pack 102 is below the threshold. Because the voltage-SOC characteristics for certain batteries drop rapidly as their SOC values approach zero, the use of a lower threshold value improves the accuracy of the cell SOC estimations that are used later on to determine the capacity values.

At step 708, if the vehicle is not in a battery capacity mode, a determination is made as to whether one or more parameters exist to force a battery capacity mode. The parameters may be provided from a user interface device, a remote computer system, or any other electronic device that allows such parameters to be sent to the battery control module of a vehicle. For example, battery control module 524 may receive a parameter from interface devices 632 (e.g., a touch screen display, a mouse, etc.) and store the parameter in parameter storage 622.

At step 716, if the vehicle is not in a battery capacity mode and a parameter does not force it to be in one, the battery pack may be charged normally, i.e., without determining cell capacities. Any standard charging method may be used when cell capacities are not determined.

At step 710, if one or more parameters indicate that a battery capacity mode should be initiated, the battery pack may be discharged until its SOC is below a lower threshold value to ensure the accuracy of the SOC measurements for the cells. For example, cell balancer 624 may additionally be configured to discharge any number of cells or modules of battery pack 102. In some embodiments, the discharged energy may be stored in a low voltage battery and provided back to battery pack 102 during the next charging cycle. In other embodiments, the discharged energy may be used to thermally condition battery pack 102.

At step 712, when the vehicle is in a battery capacity mode and the SOC of its battery pack is below a lower threshold value, the battery pack may be charged with a certain amount of amps and with a specified Ampere-hour throughput. Because voltage-SOC characteristic curves experience hysteresis (e.g., the voltage-SOC characteristic curve differs for charging and discharging), controlling the current and throughput to the battery pack allows for the corresponding voltage-SOC characteristic to be selected. For example, parameter storage 622 may store different voltage-SOC characteristics that may be selected by SOC generator 504 based on how battery pack 102 is charged. Step 712 allows battery pack 102 to be charged until a preferred region of the selected voltage-SOC characteristic is reached.

At step 714, once the battery has been charged to a desired point on the voltage-SOC characteristic curve, charging of the battery may be halted for a specified rest time. Allowing the battery pack to be in a state of rest (e.g., not charging or discharging) minimizes dynamic voltage effects caused by diffusion. The amount of rest time necessary is battery specific and depends on cell chemistry (e.g., their diffusion constants, etc.) and their temperatures. For example, when method 700 is performed in conjunction with method 300, SOC generator 604 may retrieve cell chemistry information from parameter storage 622 and temperature data from temperature sensors 506 to determine an appropriate rest time threshold.

In some embodiments, method 300 is performed after step 714 to determine cell capacity values to reduce potential sources of error. In other embodiments, method 300 may be performed in conjunction with other charging or discharging methods instead of, or in addition to, charging method 700.

Many modifications and variations of embodiments of the present invention are possible in light of the above description. The above-described embodiments of the various systems and methods may be used alone or in any combination thereof without departing from the scope of the invention. Although the description and figures may show a specific ordering of steps, it is to be understood that different orderings of the steps are also contemplated in the present disclosure. Likewise, one or more steps may be performed concurrently or partially concurrently.

The various operations of the methods and systems in the present disclosure may be accomplished using one or more processing circuits. For example a processing circuit may be an ASIC, a specific-use processor, or any existing computer processor. One or more steps or functions in the present disclosure may also be accomplished using non-transitory, machine-readable instructions and data structures stored on machine-readable media. For example, such media may comprise a floppy disc, CD-ROM, DVD-ROM, RAM, EEPROM, flash memory, or any other medium capable of storing the machine-executable instructions and data structures and capable of being accessed by a computer or other electronic device having a processing circuit.

What is claimed is:

1. A method for reducing sensor based error when determining cell capacity values for a vehicle battery pack comprising:
    receiving, at a processor, sensor data indicative of the voltage of the pack, one or more currents of the pack, and voltages for a plurality of cells in the pack;
    determining if a state of charge of the pack is below a lower voltage threshold;
    determining if a first rest time that the state of charge of the pack below the lower voltage threshold is greater than a first rest time threshold;
    determining a first set of state of charge values for the plurality of cells using a voltage-based strategy on the sensor data when the state of charge of the pack is below the lower voltage threshold value and the first rest time threshold is exceeded;
    starting a charge count when the first set of state of charge values are determined;
    determining if the state of charge of the pack is above an upper voltage threshold once the charge count is started;
    determining if a second rest time that the state of charge of the pack above the upper voltage threshold is greater than a second rest time threshold;
    determining a second set of state of charge values for the plurality of cells using a voltage-based strategy on the sensor data when the state of charge of the pack is above the upper voltage threshold value and the second rest time threshold is exceeded;
    stopping a charge count when the second set of state of charge values are determined;
    generating difference values using the differences between the state of charge values in the first and the second sets;
    calculating cell capacity values by dividing the charge count value by the difference values; and
    regulating the flow of current to the plurality of cells, wherein the amount of current that flows to each cell is determined using the cell capacity values.

2. The method of claim 1 further comprising:
determining cell capacity error values using:

$$\text{cell\_cap\_error}_i = \frac{Q_{chrg}}{\Delta SOC_i^2} * \frac{dSOC}{dV_{OC}} * \Delta V_{OC}$$

where cell_cap_error$_i$ is the cell capacity error value for the ith cell, $Q_{chrg}$ is the charge count value for the pack, $\Delta SOC_i$ is the difference value for the ith cell, SOC is the state of charge of the pack, $V_{OC}$ is the open-circuit voltage of the pack, and $\Delta V_{OC}$ is an error value associated with the voltage sensor that measures $V_{OC}$.

3. The method of claim 1, further comprising:
determining, by the processor, a cell capacity distribution over the entire pack using the cell capacity values.

4. The method of claim 1, further comprising:
discharging the pack until the state of charge is below the lower threshold value; and
storing the discharged energy in a low voltage battery.

5. The method of claim 1, further comprising:
using the cell capacity values to determine which cell has the lowest cell capacity value; and
using the lowest cell capacity value to estimate the capacity of the pack.

6. The method of claim 1, wherein the lower voltage threshold and the upper voltage threshold define a range of voltages that correspond to a relatively flat portion of a voltage-state of charge characteristic of the pack.

7. The method of claim 6, wherein the lower voltage threshold is a state of charge of about 30% and the upper voltage threshold is a state of charge of about 80%.

8. A vehicle controller comprising:
an interface configured to receive sensor data from a plurality of voltage and current sensors, wherein the sensor data is indicative of the voltage of a pack, the currents of the pack, and the voltages for a plurality of cells in the pack;
a voltage-based state of charge generator configured to generate:
a first set of state of charge values for the plurality of cells, when the state of charge of the pack is below a lower voltage threshold value, and
a second set of state of charge values for the plurality of cells, when the state of charge of the pack is above an upper voltage threshold value;
a charge counter configured to determine a charge count value for the battery pack using the sensor data, wherein the charge count is started when the first set of state of charge values are generated, and wherein the charge count is stopped when the second set of state of charge values are generated;
a rest timer configured to determine a rest time for the battery pack wherein the voltage-based state of charge generator receives the rest time from the rest timer and generates the first state of charge values and the second state of charge values only if the rest time is above a rest time threshold, and wherein the rest time threshold is determined using a diffusion time constant of the pack;
a difference evaluator configured to generate difference values using the differences between the state of charge values in the first and the second sets;
a cell capacity calculator configured to calculate cell capacity values by dividing the charge count value by the difference values; and
a cell balancer configured to regulate the flow of current to the plurality of cells, wherein the amount of current that flows to each cell is determined using the cell capacity values.

9. The controller of claim 8, wherein the processing circuit further comprises a capacity error evaluator configured to determining cell capacity error values using:

$$\text{cell\_cap\_error}_i = \frac{Q_{chrg}}{\Delta SOC_i^2} * \frac{dSOC}{dV_{OC}} * \Delta V_{OC}$$

where cell_cap_error, is the cell capacity error value for the ith cell, $Q_{chrg}$ is the charge count value for the pack, $\Delta SOC_i$ is the difference value for the ith cell, SOC is the state of charge of the pack, $V_{OC}$ is the open-circuit voltage of the pack, and $\Delta V_{OC}$ is an error value associated with the voltage sensor that measures $V_{OC}$.

10. The controller of claim 8, wherein the cell capacity calculator is further configured to determine a cell capacity distribution over the entire pack using the cell capacity values.

11. The controller of claim 8, wherein the processing circuit is further configured to use the cell capacity values to identify the cell having the lowest cell capacity value.

12. The controller of claim 11, wherein the processing circuit is further configured to use the lowest cell capacity value to estimate the capacity of the pack.

13. The method of claim 8, wherein the lower voltage threshold and the upper voltage threshold define a range of voltages that correspond to a relatively flat portion of a voltage-state of charge characteristic of the pack.

14. A system for determining cell capacity values for a vehicle battery pack comprising:
a plurality of cells within the pack;
voltage sensors configured to measure the voltage of the pack and the cells;
current sensors configured to measure the currents into and out of the pack; and
a processing circuit comprising
an interface that receives voltage data from the voltage sensors and current data from the current sensors,
a processor, and
a memory coupled to the processor, wherein the memory stores executable instructions that, when executed by the processor, cause the processor to:
determine if a state of charge of the pack is below a lower voltage threshold,
determine if a first rest time that the state of charge of the pack is below the lower voltage threshold exceeds a first rest time threshold,
determine a first set of state of charge values for the plurality of cells using a voltage-based strategy on the voltage data measured when the state of charge of the pack is below the lower voltage threshold value and the first rest time threshold is exceeded,
start a charge count when the first set of state of charge values are determined,
determine if a state of charge of the pack is above an upper voltage threshold once the charge count is started,
determine if a second rest time that the state of charge of the pack is above the upper voltage threshold exceeds a second rest time threshold,
determine a second set of state of charge values for the plurality of cells using a voltage-based strategy on the sensor data on the voltage data measured when the state of charge of the pack is above the upper voltage threshold value and the second rest time threshold is exceeded,
stop a charge count when the second set of state of charge values are determined, calculate cell capacity values using the charge count and the first and second sets of state of charge values, and regulate the flow of current to the plurality of cells, wherein the amount of current that flows to each cell is determined using the cell capacity values.

15. The system of claim 14, wherein the instructions further cause the processor to determine cell capacity error values using:

$$\text{cell\_cap\_error}_i = \frac{Q_{chrg}}{\Delta SOC_i^2} * \frac{dSOC}{dV_{OC}} * \Delta V_{OC}$$

where cell_cap_error, is the cell capacity error value for the ith cell, $Q_{chrg}$ is the charge count value for the pack, $\Delta SOC_i$ is the difference between the first and second state of charge values for the ith cell, SOC is the state of charge of the pack, $V_{OC}$ is an open-circuit voltage of the pack, and $\Delta V_{OC}$ is an error value associated with the voltage sensor that measures $V_{OC}$.

16. The system of claim 14, wherein the instructions further cause the processor to determine a cell capacity distribution over the entire pack using the cell capacity values.

17. The system of claim 14, wherein the instructions further cause the processor to determine which cell has the lowest cell capacity value.

* * * * *